(12) United States Patent
Lowrey et al.

(10) Patent No.: US 6,987,688 B2
(45) Date of Patent: Jan. 17, 2006

(54) DIE CUSTOMIZATION USING PROGRAMMABLE RESISTANCE MEMORY ELEMENTS

(75) Inventors: Tyler Lowrey, Southfield, MI (US); Guy C. Wicker, San Jose, CA (US)

(73) Assignee: Ovonyx, Inc., Rochester Hills, MI (US)

( * ) Notice: Subject to any disclaimer, the term of this patent is extended or adjusted under 35 U.S.C. 154(b) by 26 days.

(21) Appl. No.: 10/459,632

(22) Filed: Jun. 11, 2003

(65) Prior Publication Data

US 2004/0252544 A1 Dec. 16, 2004

(51) Int. Cl.
*G11C 11/00* (2006.01)

(52) U.S. Cl. .................. 365/148; 365/171; 365/158
(58) Field of Classification Search .......... 365/148, 365/171, 158, 189.05, 100; 257/724; 438/20
See application file for complete search history.

(56) References Cited

U.S. PATENT DOCUMENTS

| | | | | |
|---|---|---|---|---|
| 5,978,272 | A | * 11/1999 | Fang et al. | ............ 365/185.27 |
| 6,678,189 | B2 | * 1/2004 | Tran | ............................ 365/171 |
| 6,703,252 | B2 | * 3/2004 | Chen et al. | .................. 438/20 |
| 2003/0080414 | A1 | * 5/2003 | Kiss | .......................... 257/724 |
| 2003/0081445 | A1 | * 5/2003 | Van Brocklin et al. | ..... 365/100 |
| 2004/0037112 | A1 | * 2/2004 | Ooishi | ................... 365/185.09 |

* cited by examiner

*Primary Examiner*—David Lam
(74) *Attorney, Agent, or Firm*—Philip H. Schlazer; Marvin S. Siskin

(57) ABSTRACT

An integrated circuit chip, comprising: an electronic device; and a phase-change memory storing information of said electronic device. A method of customizing an integrated circuit chip, comprising the steps of: providing an electronic circuit on said chip; providing a phase-change memory on said chip; storing information about said electronic circuit in said phase-change memory.

11 Claims, 4 Drawing Sheets

DIE CUSTOMIZATION USING PROGRAMMABLE RESISTANCE MEMORY ELEMENTS

FIELD OF THE INVENTION

The present invention relates generally to programmable resistance memory elements. More specifically, the present invention is directed to integrated circuit customization with programmable resistance memory elements.

BACKGROUND AND PRIOR ART

Previous methods of customizing or otherwise modifying integrated circuit chips include the use of laser fuse links, one-time electrically programmable anti-fuses and other non-volatile elements such as flash floating gate cells.

Laser fuse links have several inherent disadvantages. These include the high capital cost, the large floor space, and the long manufacturing time required for the tools and processes used to laser blow the links. Also the blowing of a laser fuse must be done prior to final product packaging. This rules out die customization or modification at later steps in the manufacturing process or in the field by the customer. In addition, laser fuses take up significant die area, limiting the number of fuses than can practically be used. This limits the extent to which die customization can be exploited. Also, laser fuses can only be programmed one-time. Later additional or modified customization is not possible.

One-time electrically programmable anti-fuses also suffer from several inherent disadvantages. High voltage and power are required to program the elements. Thus, on-chip high voltage transistors of a sufficiently large size need to be provided. This uses up valuable chip real estate and limits the extent to which die-customization can be exploited. Like laser fuses, these devices can only be programmed one-time. Later additional or modified die customization is not possible.

Flash floating gate cells have yet other inherent disadvantages. High voltage and power are required to program the elements. Thus, on-chip high voltage transistors must also be provided (which as described above takes up chip space). In addition, the process of adding floating gate flash technology to an integrated circuit process is complex and often impractical. Hence, there is a need for a new way to customize integrated circuit chips.

SUMMARY OF THE INVENTION

One aspect of the present invention is an integrated circuit chip, comprising: an electronic device; and a phase-change memory storing information of said electronic device.

Another aspect of the present invention is a method of customizing an integrated circuit chip, comprising the steps of: providing an electronic circuit on said chip; providing a phase-change memory on said chip; storing information about said electronic circuit in said phase-change memory.

DETAILED DESCRIPTION OF THE INVENTION

The use of electrically programmable phase-change materials (for example, materials which can be electrically programmed between amorphous and crystalline states) for electronic memory applications is well known in the art and is disclosed, for example, in commonly assigned U.S. Pat. Nos. 5,166,758, 5,296,716, 5,414,271, 5,359,205, 5,341,328, 5,536,947, 5,534,712, 5,687,112, and 5,825,046 the disclosures of which are all incorporated by reference herein. Still another example of a phase-change memory element is provided in commonly assigned U.S. patent application Ser. No. 09/276,273, the disclosure of which is incorporated by reference herein.

Generally, phase-change materials are capable of being electrically programmed between a first structural state where the material is generally amorphous and a second structural state where the material is generally crystalline. The term "amorphous", as used herein, refers to a condition which is relatively structurally less ordered or more disordered than a single crystal. The term "crystalline", as used herein, refers to a condition which is relatively structurally more ordered than amorphous. The phase-change material exhibits different electrical characteristics depending upon its state. For instance, in its crystalline, more ordered state the material exhibits a lower electrical resistivity than in its amorphous, less ordered state.

Materials that may be used as a phase-change material include alloys of the elements from group VI of the Periodic Table. These group VI elements are referred to as the chalcogen elements and include the elements Te and Se. Alloys that include one or more of the chalcogen elements are referred to as chalcogenide alloys. An example of a chalcogenide alloy is the alloy $Ge_2Sb_2Te_5$.

Figure 1:
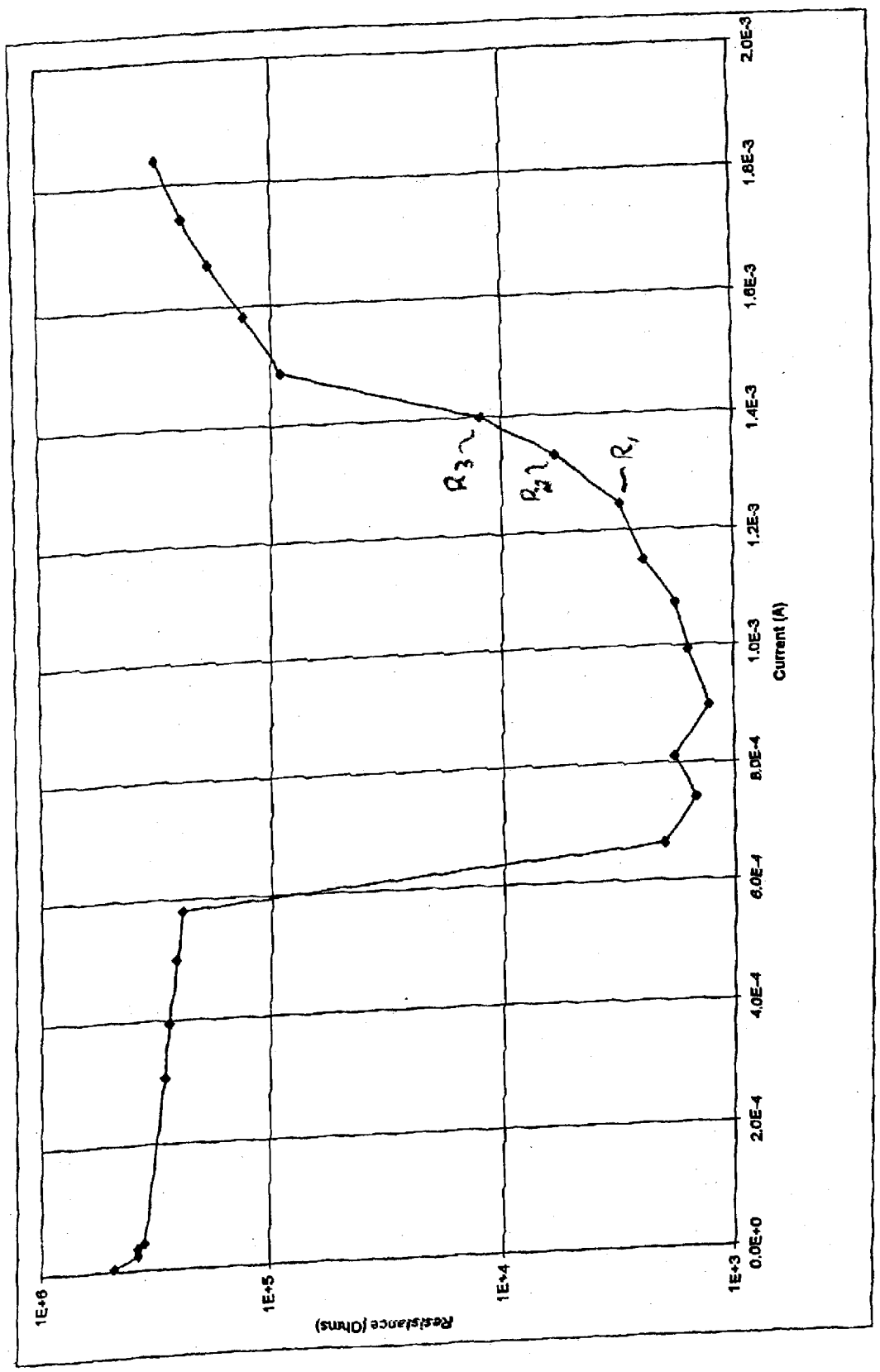
FIG. 1 is an example of the resistance curve for a chalcogenide-based phase-change memory element.

FIG. 1 is a plot of the resistance of a chalcogenide phase-change memory element versus the amplitude of a current pulse through the memory element. Referring to FIG. 1, several different programming regimes can be distinguished. In the left side of the curve, the resistance of the device remains substantially constant (i.e., in its high resistance or RESET state) until a current pulse of sufficient energy is applied. The device is then transformed from its high resistance (RESET) state to its low resistance (SET) state. The current pulse sufficient to program the memory element from the high resistance state to the low resistance state is referred to as a "set pulse". While not wishing to be bound by theory, it is believed that the set pulse is sufficient to change at least a portion of the volume of memory material from a less-ordered amorphous state to a more-ordered crystalline state.

The memory device may be programmed back from the low resistance state or SET state to the high resistance or RESET state by applying a current pulse of sufficient amplitude, referred to as a "reset pulse". While not wishing to be bound by theory, it is believed that application of a reset pulse to the memory element is sufficient to change at least a portion of the volume of memory material from a more-ordered crystalline state to a less-ordered amorphous state. The memory device may be programmed back and forth between the high resistance or RESET state and the low resistance or SET state. This type of programming scheme provides for a binary mode of operation (for example, the RESET state may be a logic 0 while the SET state may be a logic 1).

Referring to the right side of the curve of FIG. 1, as the amplitude of the current through the memory element increases, the resistance of the device increases. This increase is both gradual and reversible. In this regime, the phase-change memory element may be programmed to any resistance value within a window of resistance values bounded by the low resistance or SET state and the high resistance or RESET state. More specifically, in this regime along the right side of the curve, the phase-change memory element may be programmed from any one of the resistance states on the right side of the resistance curve to any other of the resistance states on the right side of the curve by the application of a current pulse of sufficient amplitude. The device may thus be programmed between three or more resistance values within the resistance window so as to provide for multi-state, directly overwritable data storage. While not wishing to be bound by theory, it is believed that each of the resistance states along the right side of the curve may correspond to a particular ratio of the volume of crystalline material to the volume of amorphous material in an active region of the phase-change material. Three intermediate resistance states R1, R2 and R3 are shown in the resistance curve of FIG. 1.

The present invention is related to the use of programmable resistance memory elements for the customization of integrated circuit chips (also referred to as integrated circuit dies). The integrated circuit chip includes an integrated circuit electronic device embedded on the chip. The electronic device may be any type of electronic device known in the art and includes, without limitation, memory devices, processing devices (e.g. microprocessors), logic devices, amplification devices, and signal processing devices. The integrated circuit chip further includes one or more programmable resistance memory elements that can store information about this electronic device. The programmable resistance elements are preferably phase-change elements and, more preferably, chalcogenide-based phase-change elements (that is, the phase-change material includes at least one chalcogen element).

Chip customization may be used in many ways for the benefit of the manufacturer of the chip as well as for the customer of the chip. Manufacturing use of die customization using programmable resistance memory elements may include the identification or tagging of an integrated circuit die to assist with process debugging and improvements through tracking. The information that is stored in the programmable resistance memory may include such manufacturing information as the date and time that the electronic device was made, the names of the people who made the device (such as the operator of the equipment), and the serial numbers of the machines used to make the device. The information may be related to the quality of an electronic device such the electrical performance, power consumption, and failure rate.

The information about the electronic device may be information related to device operating performance that can be used for die routing to particular product types and/or package types depending on device characteristics or variables measured at earlier steps in the manufacturing process. For example, the programmable resistance memory may store information related to device operating performance such a device speed, device power and/or device voltage. For example, the electronic device which is on a particular chip may include a transistor. The transistor may be tested during the manufacturing process to show that it has, for example, a higher than average speed or a higher than average power of similar transistors manufactured in the same batch and by the same process. This chip can be tagged so that it is routed to a high performance, faster and/or high power application.

The electronic device placed on the chip with the programmable resistance memory may itself be a memory device. In this case, the electronic device would serve as a primary memory while the programmable resistance memory would serve as a secondary memory storing information about the primary memory device. Of course, the primary memory device may also be a programmable resistance memory such as a phase-change memory where the phase-change memory preferably includes at least one chalcogen element.

Alternately, the primary memory device may be a non phase-change memory. Examples of non phase-change memories that can serve as the primary memory include volatile memories such as dynamic random access memory (DRAM) chips or static random access memory (SRAM).

The primary memory device may be a non-volatile memory such as a read only memory (ROM), programmable read only memory (PROM), erasable programmable read only memory (EPROM), and electrically erasable programmable read only memory (EEPROM). The electronic device may be a floating gate memory device such as a Flash memory device.

The programmable resistance memory, when used as a secondary memory in combination with a primary memory device, may be used to store defective address locations (if any) of the primary memory. This may be done in order to establish a memory redundancy system for the primary memory device. In addition, the programmable resistance memory may also store a mapping table which routes addresses from the defective rows and columns of the primary memory to redundant functional rows and columns of the primary memory. The storage of defective address locations as well as routing tables can be done late in the manufacturing process after packaging, after burn-in, or after high-speed sort.

It is also possible that the electronic device is an optical display. The optical display may include a plurality of pixel elements (which may be arranged in rows and columns). The programmable resistance memory may store information about the optical display. For example, the programmable resistance memory may store the addresses of the defective pixel elements as well as an error map which routes signals from the addresses of defective pixels to addresses of redundant functional pixels.

The information stored in the programmable resistance memory elements may be used for identification purposes such as to store information about an integrated circuit or mark an integrated circuit in a manner that is readable either visually or electrically. For example, the information may be related to the serialization of the integrated circuit or to how the device is configured (such as by a laser). This aids in device manufacture and provides flexibility for customer needs.

The programmable resistance memory elements may be used for the customization of an integrated circuit to give it special characteristics. The information stored in the programmable resistance elements may be used for customizing the electronic device. Product features can be added as options and one or more of these options may be activated at the end of the manufacturing process or in the field at the customer by use of the programmable resistance memory elements. Various attributes and characteristics of an individual integrated circuit chip (i.e., a "die") can be tagged on that die by programming the programmable resistance memory element with this information. This use of programmable resistance memory allows a manufacturer to set and control product options, features and even device logic after the electronic device is manufactured. The manufacturer can thus customize an electronic device at the end of the manufacturing process as needed and dictated by customer demand. These give much improved flexibility at the factory while giving rapid delivery times of customized products to customers.

The end customers may also use the programmable resistance memory to customize an integrated circuit chip. Customers use of die customization using programmable resistance memory elements would include field customization where features can be designed into an integrated circuit that allow customers to select those features after purchase. Hence, a generic integrated circuit chip can be sold to customers who can customize the chip by selecting desired features after purchase. Thus the customers can stock generic chips and customize the chips at a later time as the demand for different features dictates. Also, customers can adjust a specific die performance to their applications. For instance a generic die can be customized to emphasize low over high power performance or vice versa.

Chip customization may be implemented, for example, with the use of the programmable resistance memory in combination with control latches that are set according to the information stored in the programmable resistance memory. Generally, any type of latch known in the art may be used. For example, latches may be formed from two cross-coupled NOR gates (such as an SR latch) or two cross-coupled NAND gates. Latches may be formed as a D latch. The latches are preferably placed on the same integrated circuit chip as the programmable resistance memory and the electronic device. In fact, the latches may be included as part of the electronic device circuitry.

The logic state (for example, set or reset) of one or more control latches may be programmed and stored in the programmable resistance memory that is on the same integrated circuit chip as the control latches. The states may be loaded from the programmable resistance memory array into the control latches.

The control latches may serve, for example, as inputs to the electronic device on the chip. The control latches may be used as inputs to logic circuitry (also on the chip), comprising one or more logic gates, that control the operation of the electronic device.

The control latches may serve as inputs to programmable logic devices such as programmable read only memory, programmable logic arrays, programmable array logic devices, field programmable logic devices and field-programmable gate arrays. In addition, the latches, in combination with the programmable resistance memory, may be used to configure the logic pathways of a programmable logic device. The programmable resistance memory may be used to set the state of latches which then open and close the internal connective pathways of a programmable logic device. By opening and closing specific connective pathways, different combinational logic circuits can be created and various combinational functions can be implemented.

Figure 2:
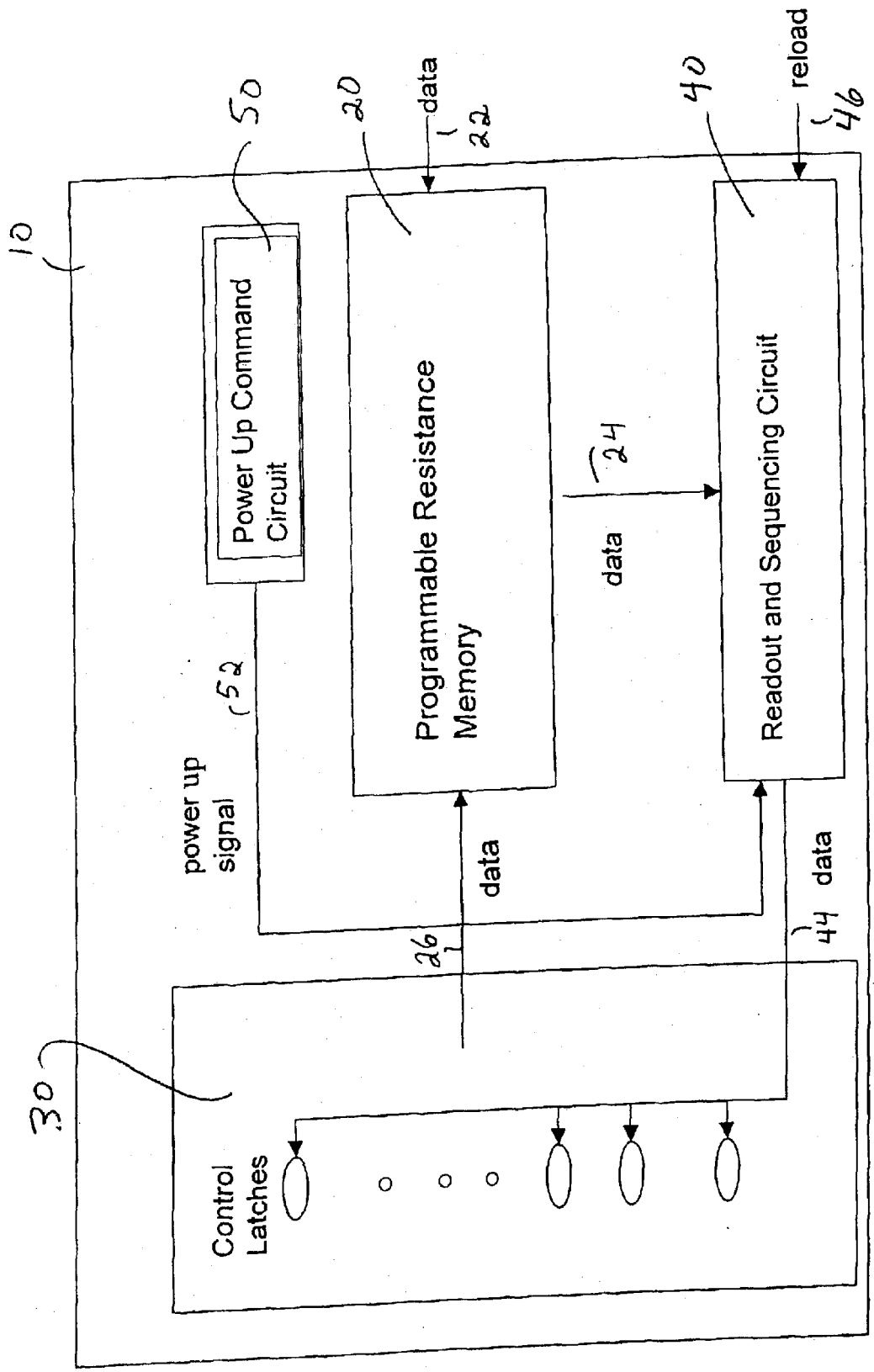
FIG. 2 is a high-level block diagram showing the connectivity between a programmable resistance memory and a plurality of control latches on an integrated circuit chip.

FIG. 2 shows a semiconductor chip 10 that includes a programmable resistance memory 20 and one or more control latches 30. Programmable resistance memory 20 may be an array of memory elements. The semiconductor chip further includes a readout and sequencing circuit 40, and a power-up command circuit 50. Data representing the proposed states of the control latches 30 is written into the programmable resistance memory. This is shown by arrow 22. When the semiconductor chip is powered up, the power up command circuit sends a power up signal to the readout and sequencing circuit 30. This is shown by arrow 52. In response to the power up signal, the readout and sequencing circuit 40 reads the data stored in the programmable resistance memory 20. The transfer of data from the programmable resistance memory 20 to the readout and sequencing circuit 40 is shown by arrow 24. The readout and sequencing circuit 40 then transfers the data to the one or more control latches 30 as shown by arrows 44. Each of the control latches 30 is set according to the data initially programmed into the programmable resistance memory. After power up, the state of the latches may be changed. This is done by first writing new data into the programmable resistance memory 20. A reload signal is then input to the readout and sequencing circuit 40 (as shown by arrow 46). Tn response to the reload signal, the new data stored in the programmable resistance memory 20 is transferred from the programmable resistance memory 20 to the readout and sequencing circuit 40. The data is then transferred from the readout and sequencing circuit 40 to the control latches 30. The states of the control latches 30 may also be read by the programmable resistance memory 20 as shown by arrow 26.

Figure 3:
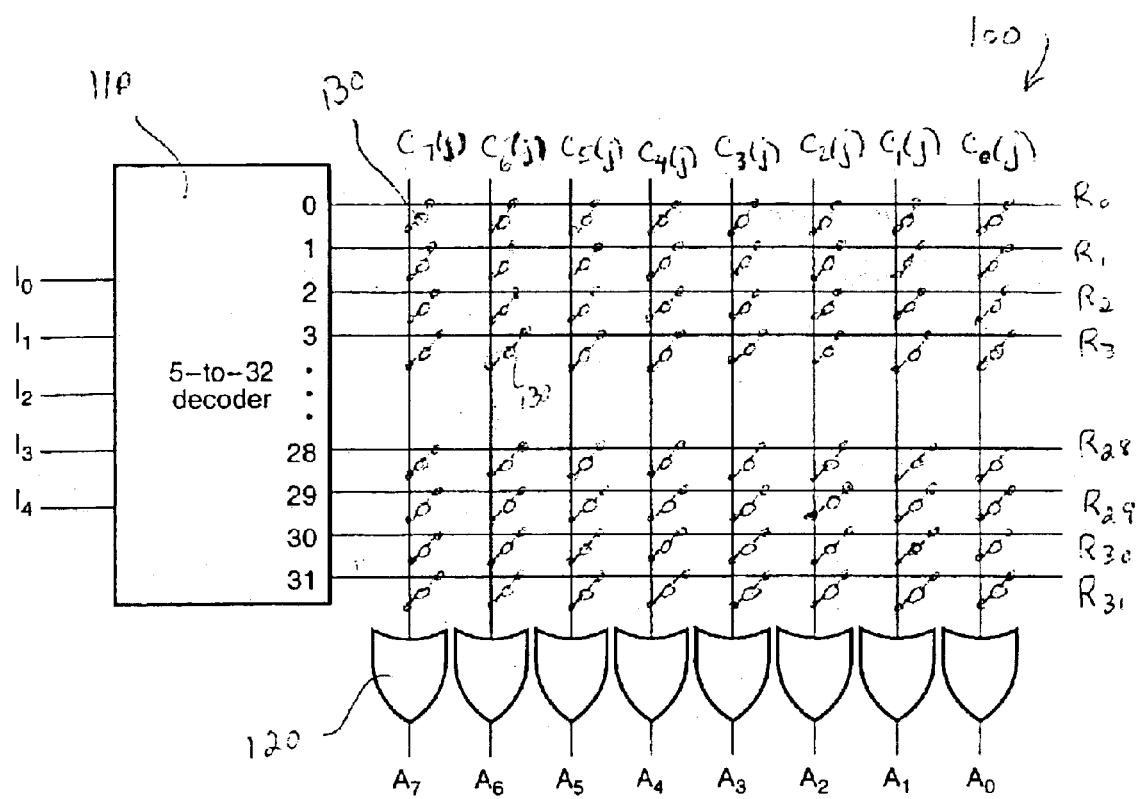
FIG. 3 shows an example of an electrically erasable programmable read only memory that uses programmable switches to control the logic connections of the memory.

As noted above, the latches, in combination with the programmable resistance memory, may be used to configure the logic of a programmable logic device. FIG. 3 shows a programmable logic device in the form of a 32×8 electrically erasable programmable read only memory (EEPROM) 100 having 5 inputs $I_0$ through $I_4$ and 8 outputs $A_0$ through $A_7$. The EEPROM 100 consists of 32 words of 8 bits each. EEPROM 100 includes a 5-to-32 decoder 110 having 5 inputs $I_0$ through $I_5$. The five inputs are decoded to 32 outputs. Each of the 32 outputs are connected by programmable connections 130 to each of the 8 OR gates 120. FIG. 3 uses the array logic convention used in complex circuits so that each OR gate 120 is considered as having 32 inputs. Hence, each one of the lines $C_0(j)$ through $C_7(j)$ shown in FIG. 3 represents 32 inputs into a respective OR gate 120. For example, line $C_7(j)$ shown in FIG. 3 represents inputs $C_7(0) \ldots C_7(31)$ into OR gate 120 with output $A_7$.

Each output line ($R_0$ through $R_{31}$) of the decoder 110 is connected by a programmable connection 130 to one of the inputs of each OR gates 120. Since each OR gate has 32 programmable connections, and since there are eight OR gates, the EEROM includes 32×8=256 programmable connections 130.

Figure 4:
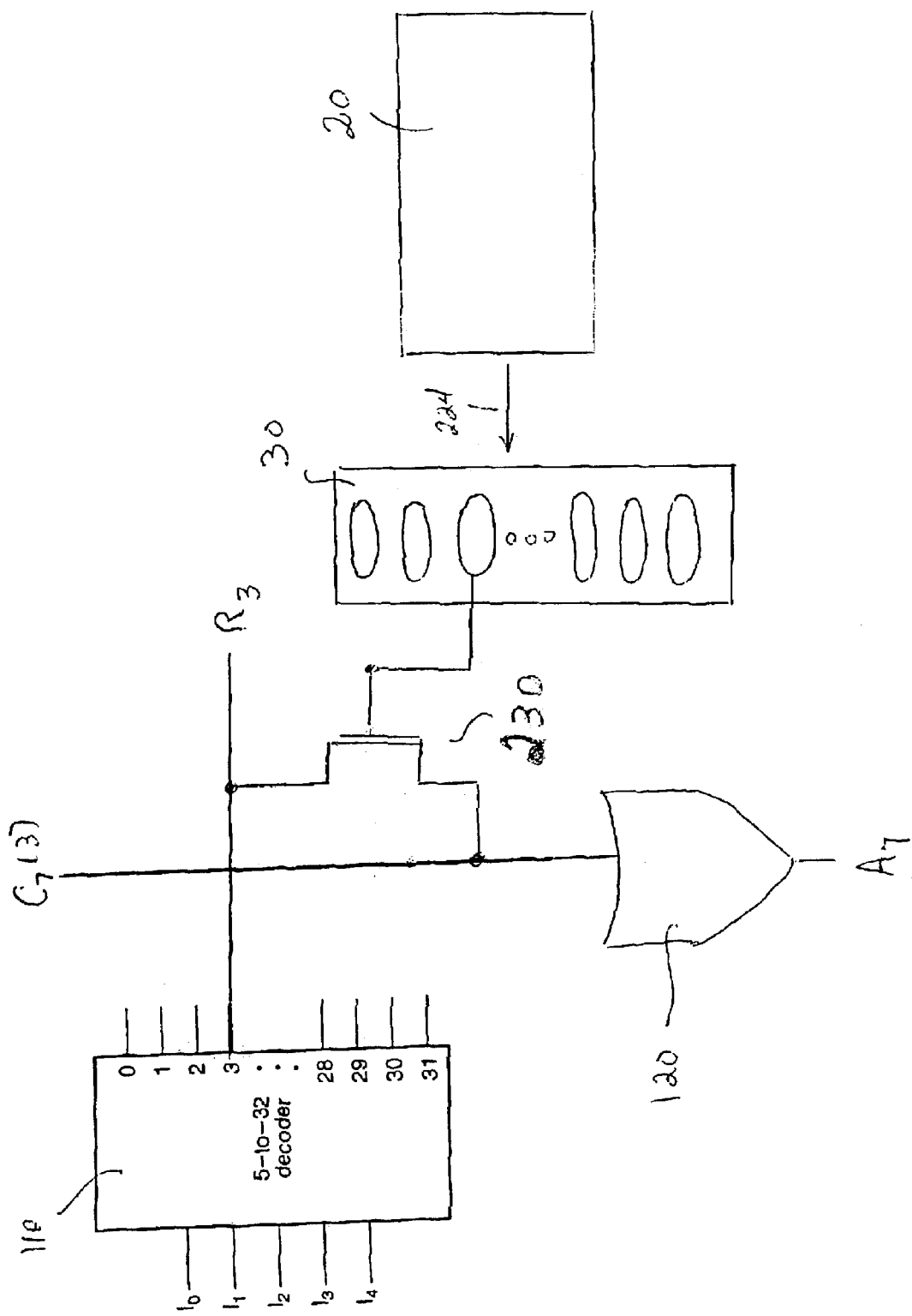
FIG. 4 shows an example of using a programmable resistance memory to control the logic connections of a programmable logic device.

FIG. 4 shows an example of how one of the decoder output lines $R_j$ can be selectively coupled to one of the OR gate inputs with the use of a latch 30, a programmable resistance memory 20, and a MOSFET transistor 230. The MOSFET transistor 230 shown in FIG. 4 is an example of the programmable connection 130 shown in FIG. 3. The output of latch 30 is coupled to the gate of the field-effect transistor 230. The transistor 230 selectively couples an output lines $R_3$ of the decoder 110 to one of the inputs $C_7(3)$ of the OR gate 120 having output $A_7$. Other types of transistors as well as other types of controllable switches may be uses instead of a MOSFET transistor. The state of the latch is set from the state of the programmable resistance memory 20. The data is transferred from the programmable resistance memory to the latches 30 as shown by arrow 224. The data may be transferred as explained above and as shown in FIG. 2.

The embodiment shown in FIG. 3 shows that the latch 30 controls the state of the transistor 230. It is conceivable, in an alternate embodiment of the invention, that the programmable resistance memory 20 may be used without the use of latch 30 to control the state of the transistor 230.

Several key attributes of programmable resistance memory devices make then ideal for above applications. These attributes include power, low voltage relatively simple programming, and compatibility with well established integrated circuit manufacturing technologies, process flows and manufacturing facilities. Programmable resistance memory elements can be readily added to most integrated circuit process with relatively few additional steps.

As noted, the programmable resistance material is preferably a phase-change material, and, more preferably, a chalcogenide material (materials which include at least one of the chalcogen elements such as Te and/or Se). Examples of chalcogenide materials are described in U.S. Pat. Nos. 5,166,758, 5,296,716, 5,414,271, 5,359,205, 5,341,328, 5,536,947, 5,534,712, 5,687,112, and 5,825,046 the disclosures of which are all incorporated by reference herein.

In addition to including at least one of the chalcogen elements, the phase-change material may further include at least one element selected from the group consisting of Ge, Sb, Bi, Pb, Sn, As, S, Si, P, and O. In one embodiment, the phase change material comprises the elements Te, Ge and Sb. In another embodiment, the phase-change material consists essentially of the elements Te, Ge and Sb. An example of a phase-change material which may be used is $Ge_2Sb_2Te_5$.

The phase-change material may include at least one transition metal element. The term "transition metal element" as used herein include the elements 21 to 30, 39 to 48, 57 and 72 to 80 from the periodic table. Preferably, the one or more transition metal elements are selected from the group consisting of Cr, Fe, Ni, Nb, Pd, and Pt. The phase-change materials which include transition metal elements may be elementally modified forms of the phase change materials in the Te—Ge—Sb ternary system. This elemental modification may be achieved by the incorporation of transition metals into the basic Te—Ge—Sb ternary system, with or without an additional chalcogen element, such as Se. The programmable resistance material layer of an memory element may have a thickness of about 600 Angstroms.

In addition to the programmable resistance material layer, the memory element preferably further includes one or more electrodes which are in electrical communication with the programmable resistance material and which deliver an electrical signal to the programmable resistance material. Generally, the one or more electrodes may take any form. The memory element may include two spacedly disposed electrodes. Examples of alternate electrode structures are described in U.S. Pat. Nos. 5,166,758, 5,296,716, 5,359,205, 5,406,509, 5,534,711 and 5,536,947 the disclosures of which are all incorporated by reference herein. An example of an electrode structure in which the electrode tapers to a peak is disclosed in U.S. Pat. No. RE37,259, the disclosures of which are both incorporated by reference herein. At least one of the electrodes (preferably, the bottom electrode) may be in the form of a conductive sidewall layer. For example, the bottom electrode may be a conductive liner or a conductive spacer. Examples of this type of electrode structure are shown in U.S. patent application Ser. Nos. 09/276,273, 09/620,318, 09/677,957 and 09/891,157, the disclosures of which are all hereby incorporated by reference herein. In yet another embodiment, the memory element may include an electrode in the form of a field emitter that is positioned in close proximity to the memory material (in this case a second electrode may or may not be used). The emitter tip serves as a source of electrons. Generally, the adhesion layers of the present invention are applicable to all memory element structures.

The programmable resistance memory elements of the present invention may be electrically coupled to isolation/selection devices and to addressing lines in order to form a memory array. The isolation/addressing devices permit each discrete memory element to be distinctively read and written to without interfering with information stored in adjacent or remote memory element of the array. Generally, the present invention is not limited to the use of any specific type of isolation/addressing device. Examples of isolation/addressing devices include field-effect transistors, bipolar junction transistors, and diodes. Examples of field-effect transistors include JFET and MOSFET. Examples of MOSFET include NMOS transistors and PMOS transistors. Furthermore NMOS and PMOS may even be formed on the same chip for CMOS technologies. The isolation devices may even include chalcogenide-based threshold switches.

Hence, associated with each memory element of a memory array structure is isolation/addressing device for that memory element thereby enabling that cell to be read and written without interfering with information stored in other adjacent or remote memory elements of the array.

As noted above, the programmable resistance material may be programmed to at least first resistance state and a second resistance state. The first resistance state has a first resistance value while the second resistance state has a second resistance value different from the first resistance value. The programmable resistance material is preferably programmed by electrical signals (such as currents). In one embodiment, the programmable resistance material is programmable to two resistance states so that each of the memory elements is capable of storing a single bit of information. In another embodiment, the programmable resistance material is programmable to at least three resistance states so that each of the memory elements is capable of storing more than one bit of information. In yet another embodiment, the programmable resistance material is programmable to at least four resistance states so that each of the memory elements is capable of storing at least two bits of information. Hence, the programmable resistance material may have a range of resistance values which is sufficient to provide for the storage of more than two bits of information.

The programmable resistance materials may be directly overwritable so that they can be programmed from any one of their resistance states to any other of their resistance states without first having to be set to a starting state. Preferably, the same programming pulse or pulses may be used to program the programmable resistance material to a specific resistance state regardless of its previous resistance state. (For example, the same current pulse or pulses may be used to program the material to its high resistance state regardless of its previous state). An example of a method of programming the memory element is provided in U.S. Pat. No. 6,075,719, the disclosure of which is incorporated by reference herein.

It is to be understood that the disclosure set forth herein is presented in the form of detailed embodiments described for the purpose of making a full and complete disclosure of the present invention, and that such details are not to be interpreted as limiting the true scope of this invention as set forth and defined in the appended claims.

We claim:

1. An integrated circuit chip, comprising:
   one or more electrically programmable phase-change memory elements;
   one or more latches electrically coupled to said phase-change memory elements; and
   a programmable logic device electrically coupled to said latches such that the states of said latches configure the logic of said programmable logic device.

2. The integrated circuit chip of claim 1, wherein said logic is determined by the states of programmable connections of said programmable logic device, said latches controlling the states of said programmable connections.

3. The integrated circuit chip of claim 1, wherein said latches are settable to states that correspond to the states of said memory elements.

4. The integrated circuit chip of claim 1, wherein each of said phase-change memory elements includes at least one chalcogen element.

5. The integrated circuit chip of claim 1, wherein each of said phase-change memory elements is programmable to at least three distinct resistance values.

6. A method of customizing an integrated circuit chip, comprising the steps of:
   storing information in one or more phase-change memory elements;
   setting the states of one or more latches according to said information;
   configuring the logic of a programmable logic device using the states of said latches.

7. The method of claim 6, wherein each of said phase-change memory elements includes at least one chalcogen element.

8. The method of claim 6, wherein said programmable logic device has one or more programmable connections, configuring the logic of said programmable logic device comprises setting the states of said programmable connections using the states of said latches.

9. An electrical circuit, comprising:
   one or more electrically programmable phase-change memory elements;
   one or more latches electrically coupled to said phase-change memory elements and
   a programmable logic device having one or more programmable connections, said latches controlling the states of said programmable connections.

10. The electrical circuit of claim 9, wherein each of said programmable connections is a transistor.

11. The electrical circuit of claim 9, wherein each of said phase-change elements includes a chalcogen element.

* * * * *